United States Patent
Altmannshofer et al.

(10) Patent No.: US 6,840,998 B2
(45) Date of Patent: Jan. 11, 2005

(54) SILICON SINGLE CRYSTAL PRODUCED BY CRUCIBLE-FREE FLOAT ZONE PULLING

(75) Inventors: Ludwig Altmannshofer, Massing (DE); Manfred Grundner, Burghausen (DE); Janis Virbulis, Burghausen (DE)

(73) Assignee: Siltronic AG, Munich (DE)

( * ) Notice: Subject to any disclaimer, the term of this patent is extended or adjusted under 35 U.S.C. 154(b) by 266 days.

(21) Appl. No.: 10/201,431

(22) Filed: Jul. 23, 2002

(65) Prior Publication Data

US 2003/0024469 A1 Feb. 6, 2003

(30) Foreign Application Priority Data

Aug. 2, 2001 (DE) .......................................... 101 37 856

(51) Int. Cl.$^7$ ......................... C30B 13/30; C01B 33/02; B32B 3/02
(52) U.S. Cl. .......................... 117/33; 423/348; 428/64.1
(58) Field of Search .............................. 117/13, 28, 30, 117/33; 423/348; 428/64.1

(56) References Cited

U.S. PATENT DOCUMENTS

| | | | |
|---|---|---|---|
| 4,851,628 A | * 7/1989 | Ammon et al. | .............. 117/52 |
| 5,462,011 A | 10/1995 | Tomzig et al. | |
| 5,487,355 A | 1/1996 | Chiou et al. | |
| 5,550,354 A | * 8/1996 | Kimura et al. | .............. 219/673 |
| 5,578,284 A | 11/1996 | Chandrasekhar et al. | |
| 5,916,364 A | 6/1999 | Izumi | |
| 5,935,321 A | 8/1999 | Chiou et al. | |
| 6,019,836 A | 2/2000 | Izumi | |
| 6,210,477 B1 | 4/2001 | Izumi et al. | |
| 6,348,095 B1 | 2/2002 | Watanabe et al. | |

FOREIGN PATENT DOCUMENTS

| | | |
|---|---|---|
| DE | 30 07 377 | 9/1981 |
| DE | 195 38 020 | 4/1997 |
| DE | 197 37 581 | 3/1999 |
| DE | 696 09 574 | 8/2000 |
| EP | 747 512 | 8/2000 |
| WO | 01/63022 | 8/2001 |

OTHER PUBLICATIONS

Wolf et al., Silicon Processing for the VLSI Era, vol. 1: Process Technology, Lattice Press, Sunset Beach, CA, USA, pp. 21–23, 1986.*
Patent Abstracts of Japan Corresponding to JP–280027.
English Derwent Abstract. AN 1981–66242D Corresponding to DE3007377.

(List continued on next page.)

Primary Examiner—Nadine G. Norton
Assistant Examiner—Matthew Anderson
(74) Attorney, Agent, or Firm—Collard & Roe, P.C.

(57) ABSTRACT

A silicon single crystal is produced by crucible-free float zone pulling, has a diameter of at least 200 mm over a length of at least 200 mm and is free of dislocations in the region of this length. A silicon wafer is separated from the silicon single crystal by a process for producing the silicon single crystal. The silicon single crystal is produced by crucible-free float zone pulling in a receptacle, in which an atmosphere of inert gas and nitrogen exerts a pressure of 1.5–2.2 bar, the atmosphere being continuously exchanged, with the volume of the receptacle being exchanged at least twice per hour. A flat coil with an external diameter of at least 220 mm is inserted in order to melt a stock ingot. The single crystal is pulled at a rate in a range from 1.4–2.2 mm/min and is periodically rotated through a sequence of rotation angles. The direction of rotation is changed, after each rotation, by a rotation angle belonging to the sequence, a change in the direction of rotating defining a turning point on the circumference of the single crystal, and at least one recurring pattern of turning points is formed, in which the turning points are distributed on straight lines which are oriented parallel to the z-axis and are uniformly spaced apart from one another.

18 Claims, 6 Drawing Sheets

OTHER PUBLICATIONS

Proceedings of the 4th International Symposium on High Purity Silicon, p. 19.
English Derwent Abstract AN 1999–168306 Corresponding to DE 197 37 581.
Patent Abstracts of Japan Corresponding to JP 2000–327477.
English Derwent Abstract AN 1997–227540 Corresponding to DE 195 38 020.

* cited by examiner

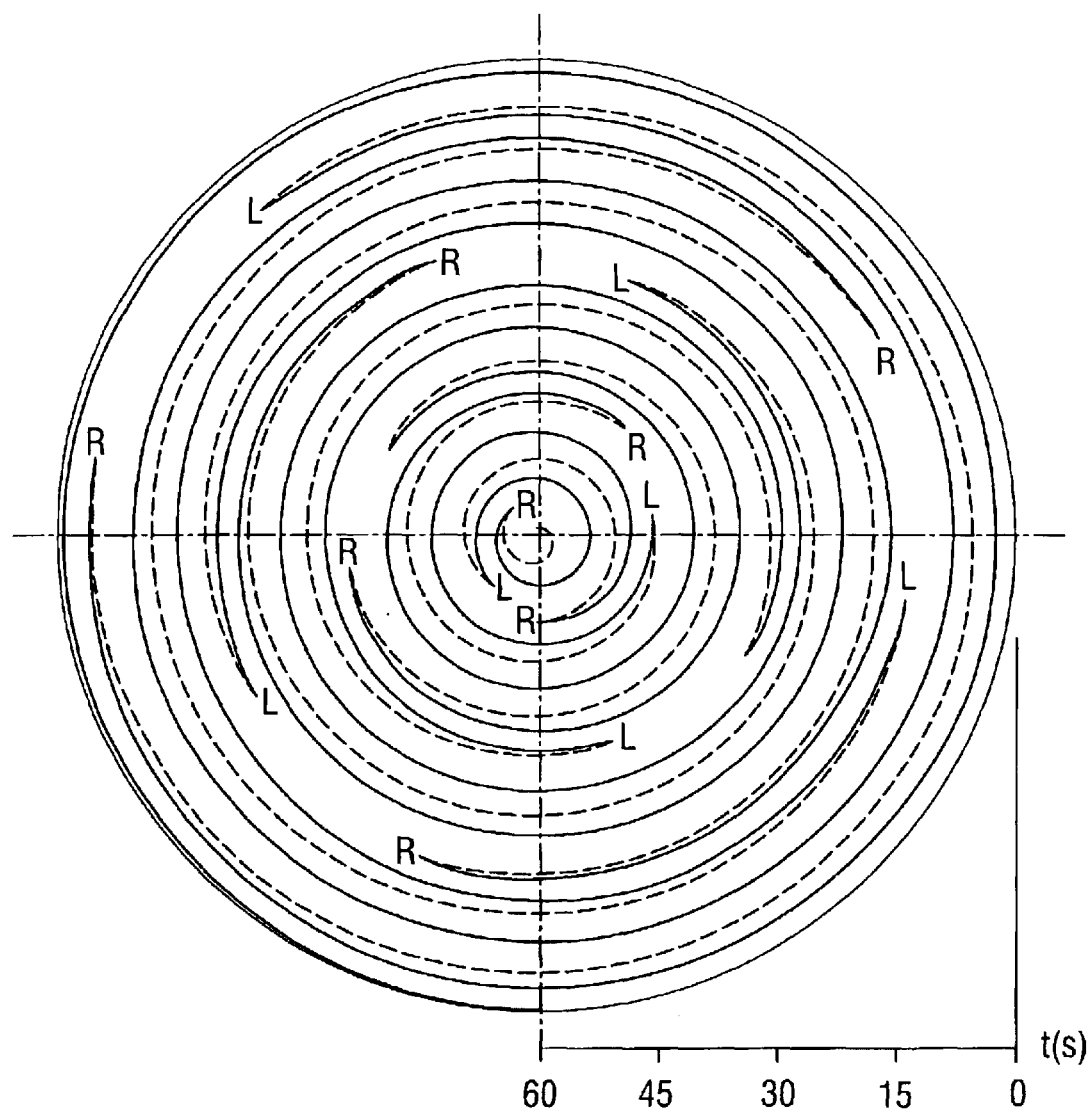

SILICON SINGLE CRYSTAL PRODUCED BY CRUCIBLE-FREE FLOAT ZONE PULLING

BACKGROUND OF THE INVENTION

1. Field of the Invention

The present invention relates to a silicon single crystal which is produced by crucible-free float zone pulling and has a large diameter.

2. The Prior Art

Pulling silicon single crystals by crucible-free float zone pulling (floating zone crystal growth, FZ pulling) is a technique which has long been known. In this technique, a polycrystalline stock ingot is gradually melted down with the aid of a high-frequency coil, and the molten material is converted into a single crystal by seeding with seed crystal in single crystal form and subsequently recrystallization. The principles of this process are described, for example, in DE-3007377 A.

Despite long years of experience gained using this technique, it has not hitherto been possible to pull dislocation-free single crystals with a diameter of significantly more than 150 mm. This objective is confronted by a whole range of difficulties. For example, relatively high electrical power is required to melt down the stock ingot, and consequently there is a particularly high likelihood of electrical spark-overs in the region of the coil supply conductors. Spark-overs of this type may end the single-crystal growth and are therefore to be avoided. Another difficulty is that of achieving a dimensionally stable growth of the single crystal which leads to the appearance of the single crystal being as far as possible cylindrical. This is because it has been found that, when it is attempted to pull single crystals with a large diameter, the growth front can all too easily break out in the radial direction. This leads to misshapen single crystals which cannot be processed into wafers or can only be processed into wafers with difficulty. However, the main problem is the considerable likelihood of dislocations forming.

SUMMARY OF THE INVENTION

Therefore it is an object of the present invention to provide a silicon single crystal by crucible-free float zone pulling which has a diameter which is considerably greater than 150 mm over a defined length and is free of dislocations in the region of this length, and also to provide a wafer which is separated from a single crystal of this type and a process for producing a single crystal of this type.

The present invention relates to a silicon single crystal having a diameter of at least 200 mm over a length of at least 200 mm, which is free of dislocations in the region of this length, obtainable by a process in which the single crystal is produced by crucible-free float zone pulling in a receptacle, in which an atmosphere of inert gas and nitrogen exerts a pressure of 1.5–2.2 bar, the atmosphere being continuously exchanged, with the volume of the receptacle being exchanged at least twice per hour, and a flat coil with an external diameter of at least 220 mm being inserted in order to melt a stock ingot, and the single crystal is pulled at a rate in a range from 1.4–2.2 mm/min and is periodically rotated through a sequence of rotation angles, and the direction of rotation is changed after each rotation through a rotation angle belonging to the sequence, a change in the direction of rotating defining a turning point on the circumference of the single crystal, and at least one recurring pattern of turning points is formed, in which the turning points are distributed on straight lines which are oriented parallel to the z-axis and are uniformly spaced apart from one another.

In addition, the present invention relates to a process for producing a silicon single crystal having a diameter of at least 200 mm over a region of a length of at least 200 mm, which is free of dislocations in said region of said length, comprising producing a silicon single crystal by crucible-free float zone pulling in a receptacle, having a volume, in which an atmosphere of inert gas and nitrogen exerts a pressure of 1.5–2.2 bar; continuously exchanging said atmosphere, with the volume of the receptacle being exchanged at least twice per hour; inserting a flat coil with an external diameter of at least 220 mm in order to melt a stock ingot; pulling the silicon single crystal at a pulling rate in a range from 1.4–2.2 mm/min and periodically rotating said silicon single crystal through a sequence of rotation angles; and changing a direction of rotation after each rotation through a rotation angle belonging to the sequence, a change in the direction of rotation defining a turning point on the circumference of the silicon single crystal, and at least one recurring pattern of turning points is formed, in which the turning points are distributed on straight lines which are oriented parallel to a z-axis and are uniformly spaced apart from one another.

It has emerged that, to achieve the object, a combination of essential process parameters and device features is required, and known parameters must in some cases remain within a tightly specified range, while parameters which have not hitherto been considered must also be taken into account.

While previously the pressure of the gas atmosphere in the receptacle has been considered a relatively uncritical parameter, it has been found that the formation of a melt neck between the stock ingot and the product ingot (single crystal) takes place in a considerably more stable manner at pressures in the range from 1.5–2.2 bar (absolute pressure), particularly preferably in the range from 1.5–2.0 bar, than at higher pressures. It is thereby possible to ensure a stable flow of molten material to the single crystal. Lower pressures appear to be even more favorable but are not preferred within the scope of the present invention, since the high electrical power which is required to melt the stock ingot causes the risk of electrical spark-overs to increase greatly.

A further important embodiment of the present invention relates to the continuous exchange of the gas atmosphere before and during the growth phase of the silicon single crystal. While single crystals of smaller diameters, which can be classified as part of the prior art, can be pulled even in a stationary gas atmosphere, this is not possible for a silicon single crystal according to the invention. This is because the heat output which is radiated by the single crystal, the melt and the stock ingot causes water and oxygen as contaminating substances to be desorbed from the walls of the receptacle. This occurs in particular in the vicinity of the molten region between the stock ingot and the single crystal. On contact with the melt, silicon oxide is formed and is deposited on the cooled high-frequency coil, accumulating to form particles. If a particle becomes detached and passes into the melt, it is highly probable that a dislocation will be formed. This risk is prevented by a gas stream which is supplied continuously, preferably from the top downward through the receptacle and exchanges the gas atmosphere in the receptacle at least twice every hour.

It is particularly preferred for the gas stream to be in the form of a laminar flow at least in the region of the side walls of the receptacle, in order to thin the contaminating substances and expel them from the receptacle. The gas stream therefore has a protective function for the interior of the receptacle, since the substances which are desorbed from the walls are entrained at the point where they are formed and are kept away from the melt.

A mixture of inert gas, preferably a mixture of argon and nitrogen, is proposed for use as the atmosphere in the receptacle. The favorable effect of nitrogen fractions in the atmosphere in connection with the suppression of electrical spark-overs and the prevention of what are known as swirl defects has already been mentioned in the prior art. With regard to the proposed continuous gas stream, optimum suppression of electrical spark-overs is achieved at a nitrogen concentration of 0.1–0.4% by volume. This quantity of nitrogen, which considerably reduces the likelihood of spark-overs, can, on account of the continuous stream of gas, be increased to this high level without nitrogen being incorporated in the silicon single crystal in a concentration of more than $2 \times 10^{15}/cm^3$.

Furthermore, it is particularly advantageous and therefore also particularly preferred if the stock ingot consisting of polycrystalline silicon has a diameter of at least 145 mm, preferably of at least 150 mm. If the stock ingot has a greater diameter, the distance between the high-frequency coil and the stock ingot also increases. As a result, the electrical field strength falls and the likelihood of electrical spark-overs is reduced. If the stock ingot has a diameter of less than 145 mm, dislocation-free pulling is usually no longer possible.

A flat coil with a feed slot and preferably three further radial slots is used to melt the stock ingot. The coil external diameter must be at least 220 mm, and an external diameter of 240–280 mm is particularly preferred. An eccentric wedge which is fitted to the coil on the opposite side from the feed slot for the high frequency and toward the single-crystal side makes the melt symmetrical and counteracts single-sided pressure which the magnetic field exerts on the melt on the side with the supply slot. The use of a flat coil provided with a wedge of this type is therefore likewise preferred and is described, for example, in U.S. Pat. No. 4,851,628. A further improvement to the symmetry of the melt is preferably achieved by the axis of the coil which leads through the central opening in the coil and the axis of the single crystal being arranged offset by 2–8 mm, particularly preferably by 5–7 mm, the axis of the single crystal being arranged offset toward the opposite side of the coil from the supply slot. Furthermore, it is also preferable to use a reflector which reduces thermal stresses in the single crystal. The length of the reflector is to be selected in such a way that at least the plastic region of the crystal is covered. A reflector of this type is disclosed, for example, in the abovementioned publication DE 3007377 A.

Details relating to pulling rates are highly unspecific in the specialist literature and cover a wide range of 0.5–30 mm/min (Proceedings of the *4th International Symposium on High Purity Silicon*, p. 19). It is also known that the dislocation frequency increases considerably at lower pulling rates. However, a lower limit rate is not clearly defined and, moreover, is dependent on the diameter of the single crystal. On the other hand, in connection with the invention it has been established that the frequency of electrical spark-overs, the likelihood of dislocations being formed and the occurrence of what are known as crystal crackings increases at pulling rates which are higher than 2.2 mm/min. Therefore, when producing the silicon single crystal according to the invention it is necessary to maintain a pulling rate which lies in the range of 1.4–2.2 mm/min, particularly preferably 1.5–2 mm/min.

Finally, it is also part of the prior art to rotate the single crystal about its axis, in one direction or with an alternating direction of rotation, during the pulling. The alternating rotation is intended to effectively mix the melt and thereby achieve a homogeneous distribution of dopants (JP-2820027). To allow a single crystal with a diameter of 200 mm to grow in a dimensionally stable manner, i.e. without lateral spalling, however, it has to be subjected to a particular alternating rotation. The single crystal is periodically rotated through a sequence of rotation angles, and the direction of rotation is changed after each rotation through a rotation angle belonging to the sequence. A change in the direction of rotation defines a turning point on the circumference of the single crystal, and at least one recurring pattern of turning points is formed, in which pattern the turning points are distributed on straight lines which are oriented parallel to the z-axis and are uniformly spaced apart from one another.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

The rotation of the single crystal is explained in more detail below with reference to figures.

In the drawings, wherein similar reference characters denote similar elements throughout the several views:

FIGS. 1 and 2 show sequences of rotation angles;

FIGS. 3, 4 and 5 show polar coordinate illustrations of patterns of turning points in accordance with the present invention;

FIG. 6 shows a track illustration of turning points which are preferred in terms of the time at which they appear and their position; and FIG. 7 shows an opposite example to FIG. 6.

DETAILED DESCRIPTION OF PREFERRED EMBODIMENTS

Turning now in detail to the drawings, according to the invention, the single crystal is rotated through a sequence of rotation angles, the direction of rotation changing after reach rotation in the sequence. After the single crystal has been rotated through the last rotation angle in the sequence, a new period begins as a result of the single crystal being rotated again through the first rotation angle of the sequence. A sequence of rotation angles preferably comprises two to ten rotation angles.

Figure 1:
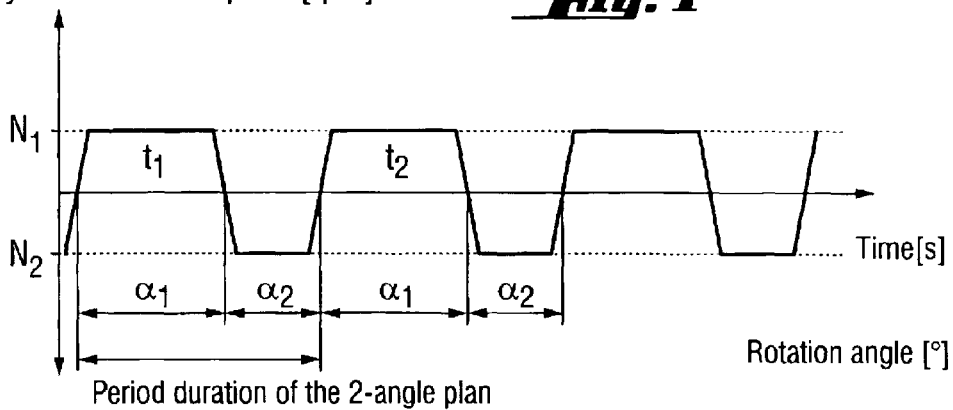
Figure 2:
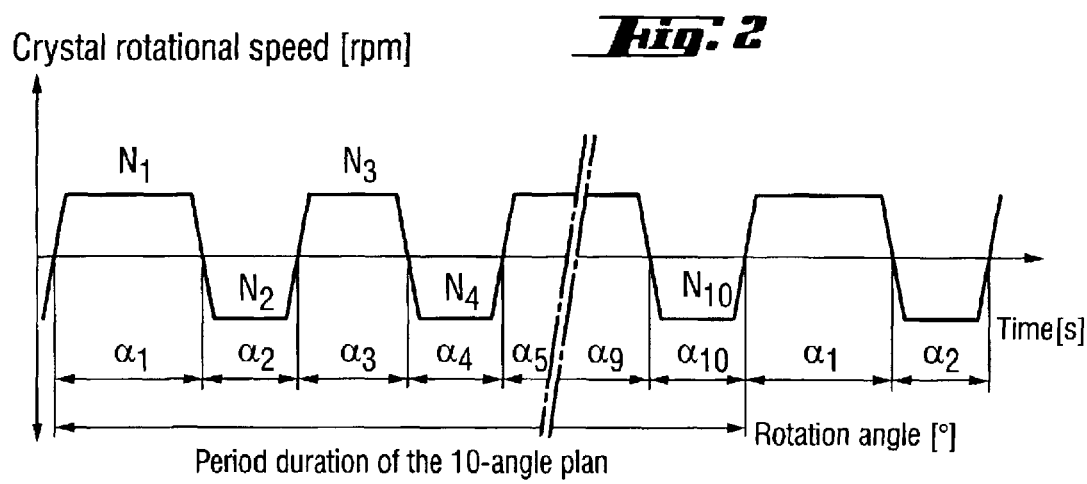

FIG. 1 shows the development over time for a sequence of two rotation angles $\alpha_1$ and $\alpha_2$. A sequence of this type is designated to be a two-angle plan. Accordingly, the sequence illustrated in FIG. 2 is a ten-angle plan comprising the rotation angles $\alpha_1$ to $\alpha_{10}$. In the example shown in FIG. 1, the single crystal is first of all rotated clockwise through the angle $\alpha_1$ at a rotational speed N1. There then follows a change in the direction of rotation and a rotation in the counterclockwise direction through the angle $\alpha_2$ at a rotational speed N2, followed by periodically recurring rotations through $\alpha_1$ and $\alpha_2$. The time at which a change in the direction of rotation occurs is known as a turning point. During the growth of the single crystal, a multiplicity of turning points are passed through.

According to the invention, the choice of rotation angle is not to occur randomly, but rather in such a manner that the turning points form at least one recurring pattern in which they are distributed homogeneously over the circumference of the single crystal, lying on straight lines which are parallel to the z-axis. This requirement can best be illustrated with the aid of a polar coordinate illustration as in FIG. 3. The radius of the coordinate system in the illustration selected corresponds to a time axis representing the duration of crystal growth. However, the duration of crystal growth could also be indicated by the crystal length in the direction of the z-axis. The angles of the coordinate system denote positions on the circumference of the single crystal. Turning points are marked by the letters R and L in the illustration, R representing a change in the direction of rotation to rotation in the counterclockwise direction. L represents a change in the direction of rotation to a rotation in the clockwise direction. At the selected rotational speeds, after 360 seconds the turning points form a rosette-like pattern. This pattern is formed, for example, during a rotation which is based on a two-angle plan with rotation angles of $\alpha_1=400°$ and $\alpha_2=260°$ and rotation speeds of $N_R=20$ rpm and $N_L=-20$ rpm. The turning points are distributed on straight lines which are oriented in the z direction at regular intervals of 20° over the circumference of the single crystal.

Figure 4:
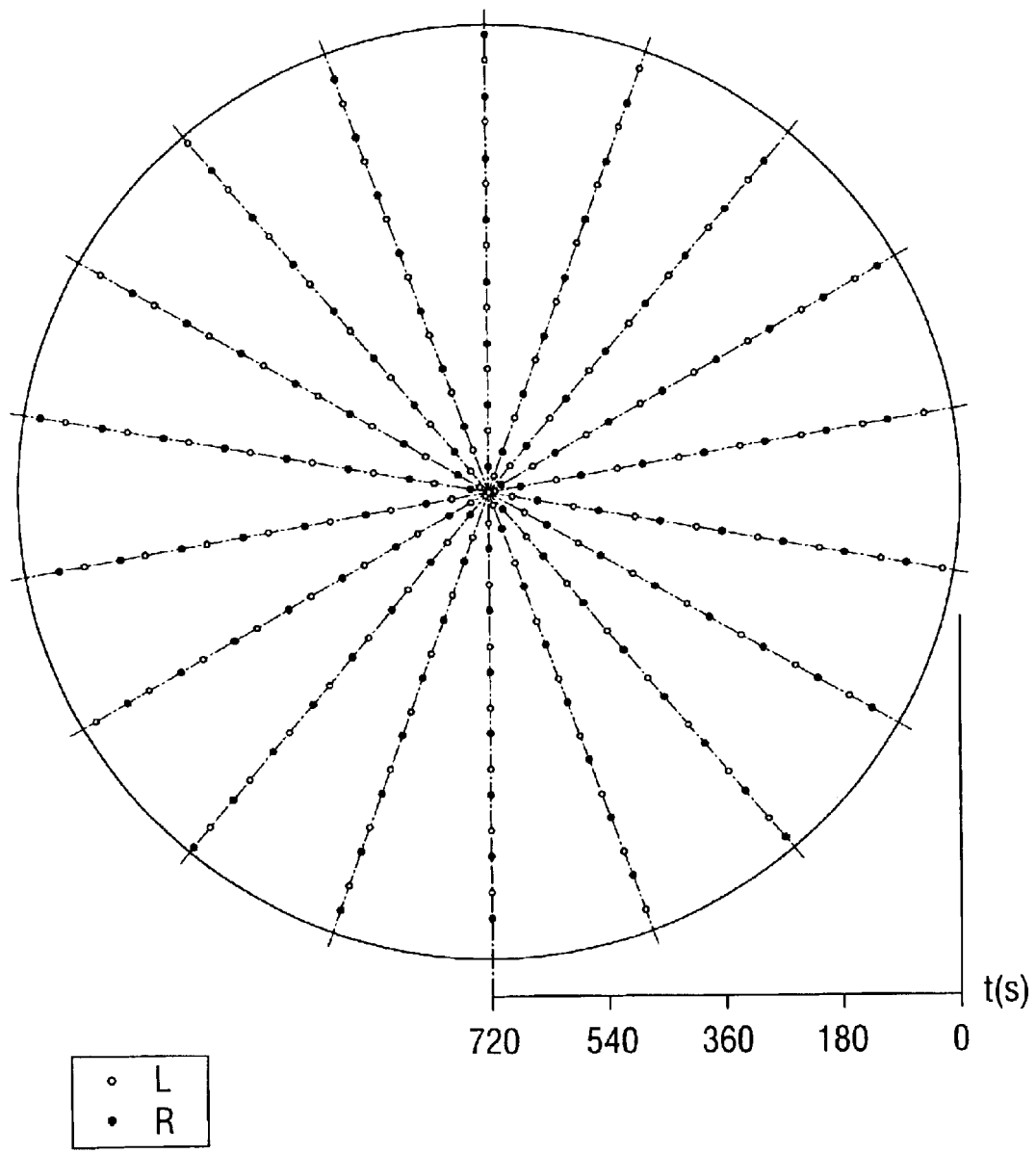
Figure 5:
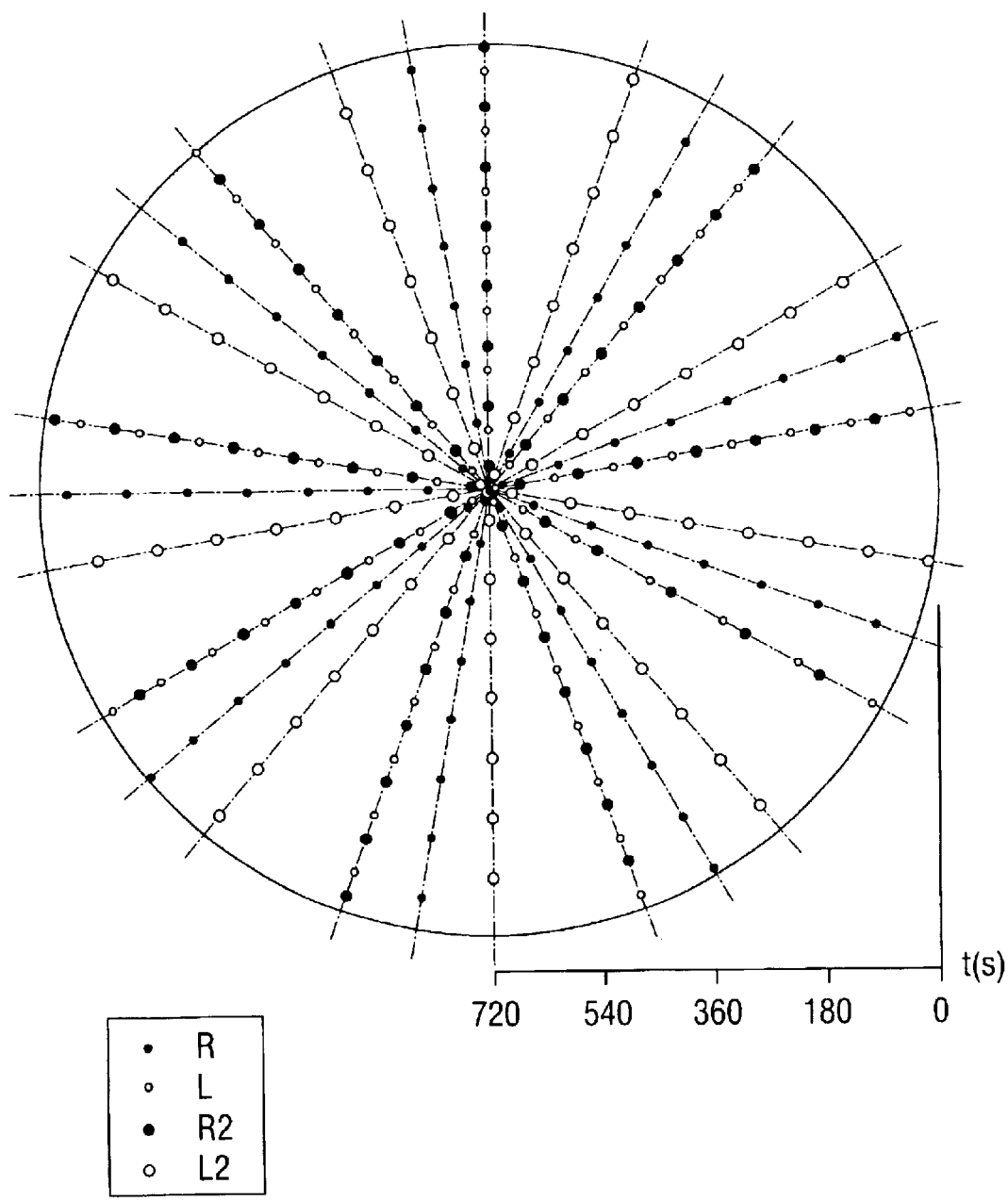

FIG. 4 shows the situation after 720 seconds. It can be seen that the pattern recurs with the same angles. The first complete pattern, which recurs periodically and with the same angles, is referred to as the basic pattern (spectral frequency). It is also possible for a plurality of patterns to be superimposed, as for example the patterns shown in FIG. 5, which are formed by the turning points R, L, R2 and L2 of a four-angle plan. The straight lines belonging to one pattern are at identical distances from one another, and consequently the turning points of one pattern lie distributed uniformly over the circumference of the single crystal.

It has-proven particularly advantageous if the turning points lie on at least four, preferably 8–48 straight lines. It is also particularly preferred if the number of straight lines corresponds to a multiple of the number of ridges. The number of ridges is predetermined by the symmetry of the crystal structure.

Figure 3:
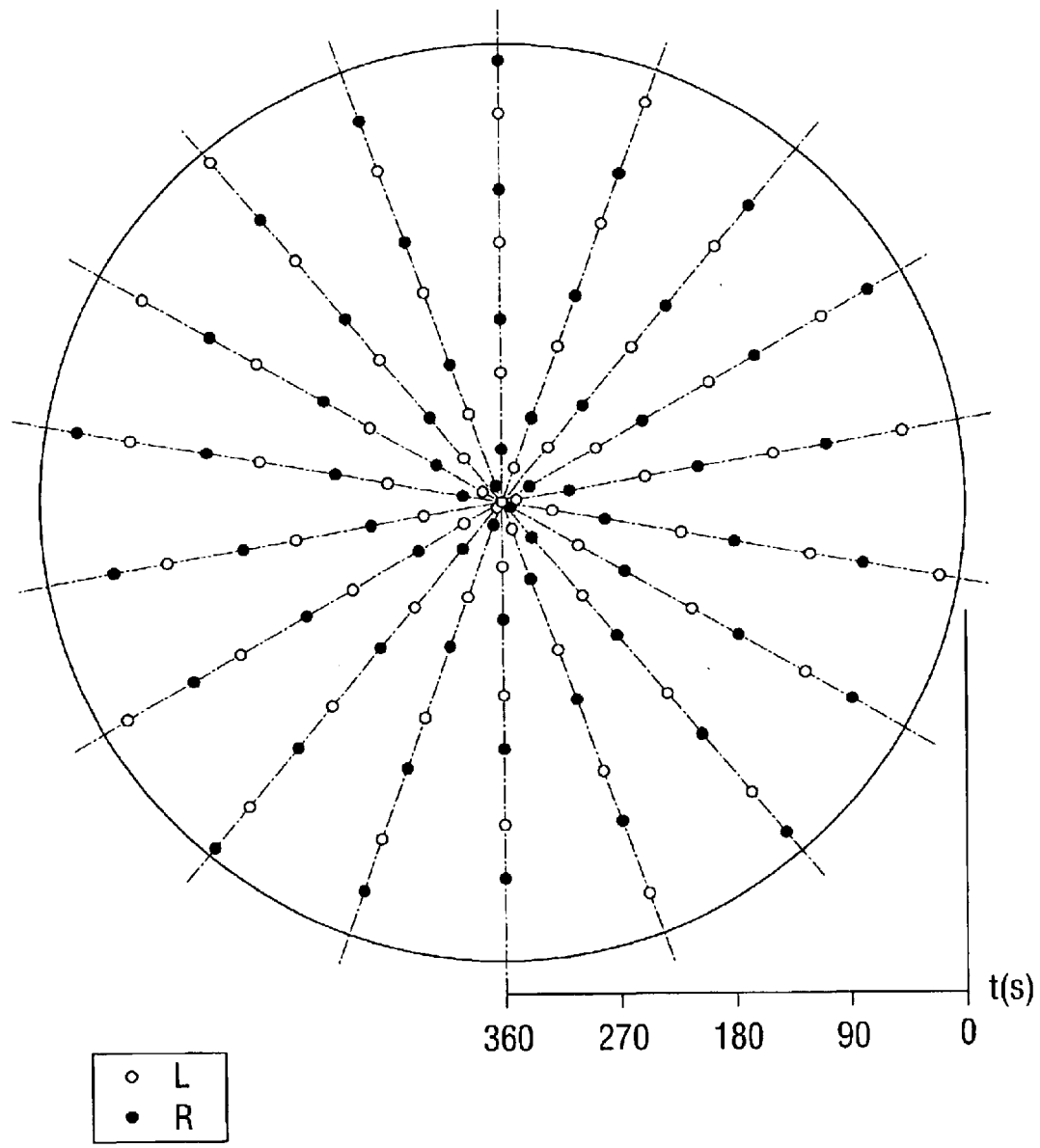
Figure 6:
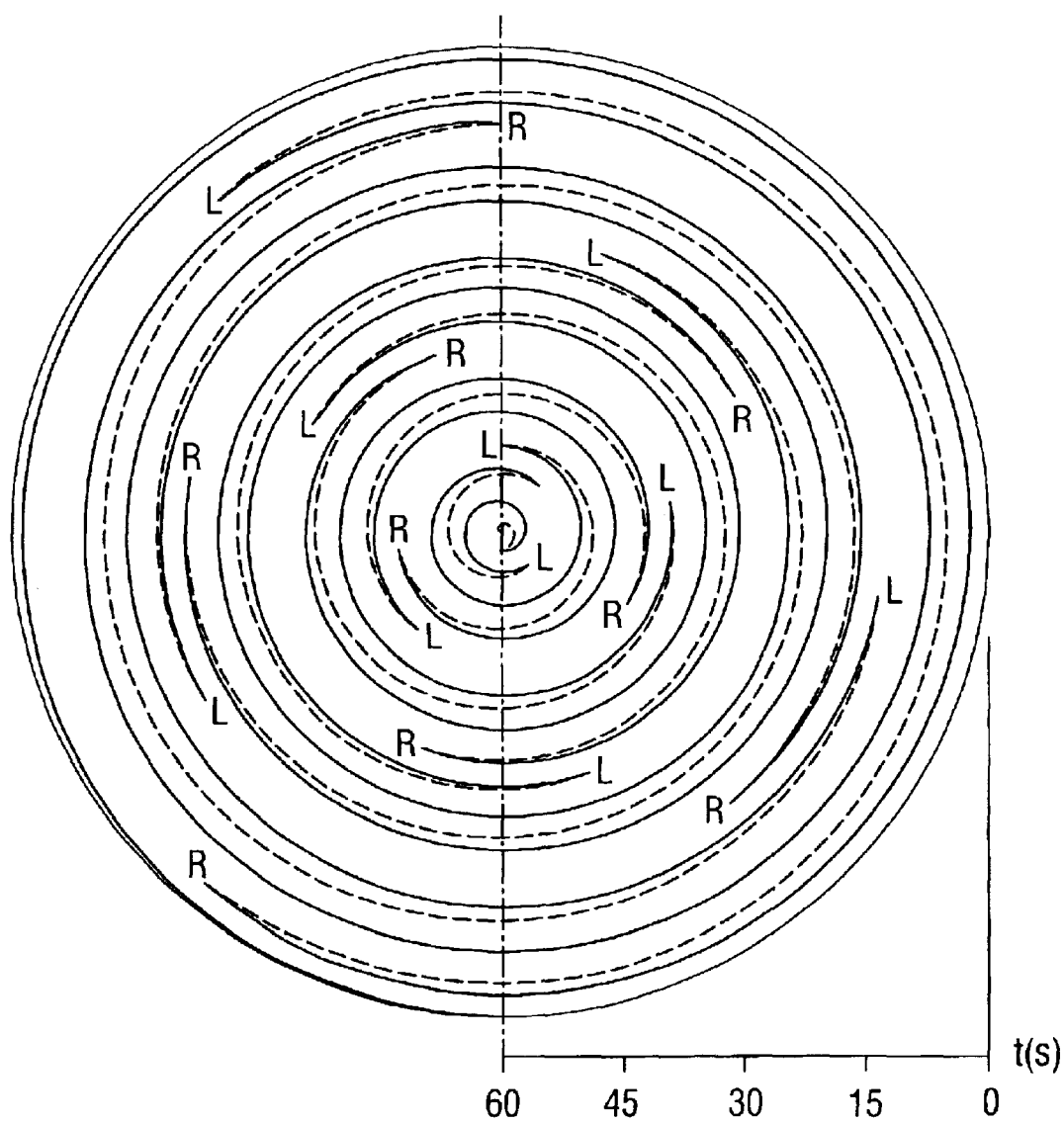

FIG. 6 corresponds to the illustration shown in FIG. 3, except that the turning points are shown linked by tracks and the radius only covers a period of 60 seconds. This track illustration shows what is known as overlapping operation, which is preferred because it promotes the formation of narrow ridges and counteracts the formation of dislocations. In the case of overlapping operation, after the direction of rotation has changed rotation continues through a rotation angle which is $n*360°+\Delta$, where n is an integer number, preferably 1 or 2, and $\Delta$ may adopt a positive value up to 90°. This is expressed in the track illustration by the fact that the tracks cover temporally adjacent turning points which are considered in a 90° segment. For contrast, reference is made to FIG. 7, which represents a non-overlapping operation which incorporates gaps.

To achieve crystal growth which is as cylindrical as possible, it is furthermore preferred for the sequence of rotation angles to be selected in such a way that the turning points are distributed as uniformly as possible over the circumference of the single crystal even while the basic pattern is being built up. This is the case in particular if temporally successive pairs of turning points lie opposite one another in offset fashion, as shown in FIG. 6.

When the sequence of rotation angles is fixed, the rotation of the single crystal should be controlled as precisely as possible, so that the desired cylindrical growth of the single crystal is established. The angle errors which are made during control of the rotational movement with a changing direction of rotation should in total not exceed an angle error of ±1°.

EXAMPLE

A silicon single crystal with a diameter of 204 mm, which was free of dislocations over a length of more than 200 mm, was pulled. In the preparatory phase, a polycrystalline stock ingot with a diameter of 155 mm was fitted into a receptacle. A seed crystal, a high-frequency coil designed as a flat coil (pancake coil) and a reflector for the single crystal were also provided in the receptacle. In a pumping phase, the receptacle was firstly evacuated and then filled with argon (1.65 bar) and nitrogen (0.3% by volume). Then, a gas mixture comprising argon and nitrogen was passed through the receptacle. The throughput was 4200 l/h s.t.p. (argon) and 13 l/h s.t.p. (nitrogen).

During a preheating phase, the stock ingot was heated on its lower end side, initially with the aid of a preheating ring and then by the high-frequency coil. After a molten droplet had formed on the seed crystal, the seed crystal was placed onto the stock ingot and the pulling of the single crystal was commenced, with the diameter of the single crystal initially being continuously widened.

At the start of this cone phase, the single crystal was rotated in one direction. Before pulling of the cylindrical part of the single crystal had even started, the operation was switched to changing directions of rotation in accordance with the invention. The pulling rate was 1.8 mm/min during pulling of the cylindrical part of the single crystal. In a final phase of the pulling operation, the diameter of the single crystal was reduced to an end cone, and after cooling the single crystal was removed from the receptacle.

Accordingly, while a few embodiments of the present invention have been shown and described, it is to be understood that many changes and modifications may be made thereunto without departing from the spirit and scope of the invention as defined in the appended claims.

What is claimed is:

1. A silicon single crystal produced by crucible-free float zone pulling, comprising
   a silicon single crystal having a diameter of at least 200 mm over a length of at least 200 mm and being free of dislocations in a region of said length.

2. A silicon wafer which is separated from the silicon single crystal as claimed in claim 1.

3. A silicon single crystal having a diameter of at least 200 mm over a region of a length of at least 200 mm, which is free of dislocations in said region of said length, obtainable by a process in which the silicon single crystal is produced by
   crucible-free float zone pulling in a receptacle, having a volume, in which an atmosphere of inert gas and nitrogen exerts a pressure of 1.5–2.2 bar, the atmosphere being continuously exchanged, with the volume of the receptacle being exchanged at least twice per hour;
   inserting a flat coil with an external diameter of at least 220 mm in order to melt a stock ingot;
   pulling the silicon single crystal at a pulling rate in a range from 1.4–2.2 mm/min and periodically rotating the silicon single crystal through a sequence of rotation angles; changing a direction of rotation after each rotation through a rotation angle belonging to the sequence, a change in the direction of rotation defining a turning point on the circumference of the silicon single crystal, and at least one recurring pattern of turning points is formed, in which the turning points are distributed on straight lines which are oriented parallel to a z-axis and are uniformly spaced apart from one another.

4. The silicon single crystal as claimed in claim 3, for which a stock ingot with a diameter of at least 145 mm is used.

5. The silicon single crystal as claimed in claim 3, for which the pressure in the receptacle is 1.5–2.0 bar.

6. The silicon single crystal as claimed in claim 3, for which a laminar gas flow is maintained along walls of the receptacle.

7. The silicon single crystal as claimed in claim 3, for which the concentration of nitrogen in the receptacle is 0.1–0.4% by volume.

8. The silicon single crystal as claimed in claim 3 for which the external diameter of the flat coil is 240–280 mm.

9. The silicon single crystal as claimed in claim 3, for which the pulling rate is 1.5–2 mm/min.

10. The silicon single crystal as claimed in claim 3, which is rotated with a changing direction of rotation, and changes in the direction of rotation being distributed homogeneously over a circumference of the silicon single crystal and forming a pattern which recurs periodically.

11. A process for producing a silicon single crystal having a diameter of at least 200 mm over a region of a length of at least 200 mm, which is free of dislocations in said region of said length, comprising producing a silicon single crystal by crucible-free float zone pulling in a receptacle, having a volume, in which an atmosphere of inert gas and nitrogen exerts a pressure of 1.5–2.2 bar;

continuously exchanging said atmosphere, with the volume of the receptacle being exchanged at least twice per hour;

inserting a flat coil with an external diameter of at least 220 mm in order to melt a stock ingot;

pulling the silicon single crystal at a pulling rate in a range from 1.4–2.2 mm/min and periodically rotating said silicon single crystal through a sequence of rotation angles; and changing a direction of rotation after each rotation through a rotation angle belonging to the sequence, a change in the direction of rotation defining a turning point on the circumference of the silicon single crystal, and at least one recurring pattern of turning points is formed, in which the turning points are distributed on straight lines which are oriented parallel to a z-axis and are uniformly spaced apart from one another.

12. The process for producing a silicon single crystal as claimed in claim 11, comprising using a stock ingot with a diameter of at least 145 mm.

13. The process for producing a silicon single crystal as claimed in claim 11, wherein the pressure in the receptacle is 1.5–2.0 bar.

14. The process for producing a silicon single crystal as claimed in claim 11, comprising maintaining a laminar gas flow along walls of the receptacle.

15. The process for producing a silicon single crystal as claimed in claim 11, wherein concentration of nitrogen in the receptacle is 0.1–0.4% by volume.

16. The process for producing a silicon single crystal as claimed in claim 11, wherein the external diameter of the flat coil is 240–280 mm.

17. The process for producing a silicon single crystal as claimed in claim 11, wherein the pulling rate is 1.5–2 mm/min.

18. The process for producing a silicon single crystal as claimed in claim 11, comprising rotating said silicon single crystal with a changing direction of rotation, and changes in the direction of rotation being distributed homogeneously over a circumference of the silicon single crystal and forming a pattern which recurs periodically.

* * * * *